(12) United States Patent
Tripathi et al.

(10) Patent No.: US 7,414,462 B2
(45) Date of Patent: Aug. 19, 2008

(54) DIFFERENTIAL RECEIVER CIRCUIT

(75) Inventors: Divya Tripathi, Bhopal (IN); Jaideep Banerjee, Haryana (IN); Qadeer A. Khan, New Delhi (IN)

(73) Assignee: Freescale Semiconductor, Inc., Austin, TX (US)

( * ) Notice: Subject to any disclaimer, the term of this patent is extended or adjusted under 35 U.S.C. 154(b) by 241 days.

(21) Appl. No.: 11/443,405

(22) Filed: May 30, 2006

(65) Prior Publication Data

US 2007/0279125 A1 Dec. 6, 2007

(30) Foreign Application Priority Data

May 31, 2005 (IN) .................. 1404/DEL/2005

(51) Int. Cl.
*G06G 7/12* (2006.01)
*G06G 7/26* (2006.01)

(52) U.S. Cl. ...................... 327/563; 327/562

(58) Field of Classification Search .......... 327/560–563
See application file for complete search history.

(56) References Cited

U.S. PATENT DOCUMENTS 5,973,515 A * 10/1999 Marbot et al. ................. 327/65
6,069,515 A 5/2000 Singh
2003/0076163 A1 * 4/2003 Hangaishi ................... 327/563
2003/0193350 A1 10/2003 Chow
2004/0189386 A1 * 9/2004 Nishimura ................... 330/253

* cited by examiner

*Primary Examiner*—Quan Tra
(74) *Attorney, Agent, or Firm*—Charles Bergere

(57) ABSTRACT

A differential receiver circuit receives a differential input signal including first and second input signals (DP, DM) and generates a single-ended output signal. The receiver circuit includes first and second comparators that receive the differential input signal and generate respective first and second differential output signals. A current summer is connected to the first and second comparators and receives the first and second differential output signals and generates a third differential output signal. A differential to single-ended converter is connected to the current summer and receives the third differential output signal and generates the single-ended output signal. The differential input signal varies from a ground voltage level to an external reference voltage level (VUSB), while the first and second comparators are made with devices that operate at an internal reference voltage level that is lower than the external reference voltage level.

7 Claims, 1 Drawing Sheet

DIFFERENTIAL RECEIVER CIRCUIT

BACKGROUND OF THE INVENTION

The present invention relates generally to integrated circuits and, more particularly, to receiver circuits for integrated circuits.

Continued reduction of integrated circuit sizes has led to a lowering of voltage supply levels in monolithic integrated circuits and a corresponding usage of low voltage devices. However, the peripheral circuits and I/O supply levels continue to operate at higher voltage supply levels. For example, a bus driver circuit may operate at 3.3V, but the process may not support such high voltage devices. Operating the lower voltage devices at higher voltage levels leads to reliability issues like hot carrier injection, gate oxide, and source drain breakdown.

Accordingly, it is an object of the present invention to provide a receiver circuit formed with low voltage devices, yet operable with a higher supply voltage without degrading device reliability.

BRIEF DESCRIPTION OF THE DRAWINGS

The following detailed description of a preferred embodiment of the invention will be better understood when read in conjunction with the appended drawings. The present invention is illustrated by way of example and not limited by the accompanying figures, in which like references indicate similar elements.

DETAILED DESCRIPTION OF THE INVENTION

The detailed description in connection with the appended drawings is intended as a description of one embodiment of the invention, and is not intended to represent the only form in which the present invention may be practiced. It is to be understood that the same or equivalent functions may be accomplished by different embodiments that are intended to be encompassed within the spirit and scope of the invention.

The present invention provides a differential receiver circuit that receives a differential input signal including first and second input signals (DP, DN) and generates a single-ended output signal. The receiver circuit includes first and second comparators that receive the differential input signal and generate respective first and second differential output signals. The first and second comparators comprise first and second pluralities of transistors. A current summer is connected to the first and second comparators and receives the first and second differential output signals and generates a third differential output signal. A differential to single-ended converter is connected to the current summer and receives the third differential output signal and generates the single-ended output signal. The differential input signal varies from a ground voltage level to an external reference voltage level (VUSB), and the first and second pluralities of transistors are low voltage devices that operate at an internal reference voltage level that is lower than the external reference voltage level.

The differential receiver circuit of the present invention is useful for I/O drivers that have an output signal swing from, for example, 0 to 3.3V yet the circuit is fabricated with 2.5V devices, such as full and low speed Universal Serial Bus (USB) receivers.

Figure 1:
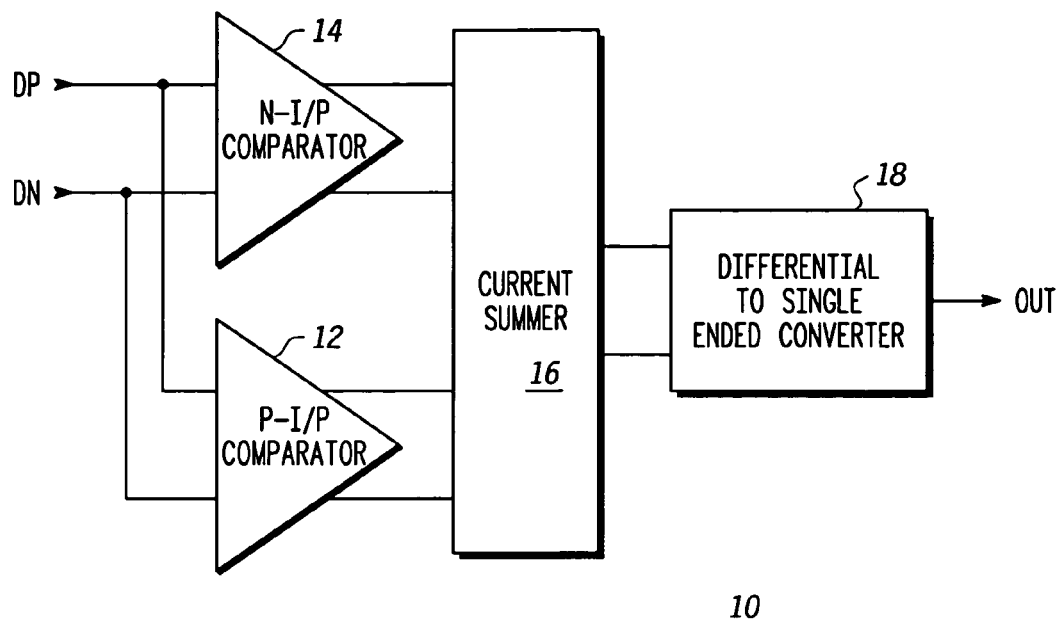
FIG. 1 is a schematic block diagram of a differential receiver circuit in accordance with the present invention.

Referring now to FIG. 1, a schematic block diagram of a differential receiver circuit 10 in accordance with the present invention is shown. The differential receiver circuit 10 receives a differential input signal DP and DN and provides a single-ended output signal (out) at an output node. The embodiment of the invention shown is for a Universal Serial Bus (USB) driver. A differential receiver circuit that receives a differential input signal including a first input signal (DP) and a second input signal (DN), and generates a single-ended output signal. The receiver circuit 10 includes a first comparator 12 that receives the differential input signal (DP and DN) and generates a first differential output signal, and a second comparator 14 that receives the differential input signal and generates a second differential output signal. A current summer 16 is connected to the first and second comparators 12 and 14 and receives the first and second differential output signals and generates a third differential output signal. A differential to single-ended converter 18 is connected to the current summer 16 and receives the third differential output signal and generates the single-ended output signal.

The first and second comparators 12 and 14 comprise first and second respective pluralities of transistors. The receiver circuit 10 is designed to receive a differential input signal that varies from a ground voltage level to an external reference voltage level (VUSB), and the first and second pluralities of transistors comprise devices that operate at an internal reference voltage level that is lower than the external reference voltage level. For example, if the receiver circuit 10 is used as a USB receiver, then the input signal varies from the ground voltage to the first reference voltage (VUSB), with the first reference voltage being about 3.3 v (but could go up to about 3.6 v), and the first and second pluralities of transistors are 2.5 v devices. The receiver circuit 10 has a high reference voltage signal of about 2.6 V and a low reference voltage signal of about 660 mV. As will become apparent, since in the USB embodiment the maximum input voltage can go up to about 3.6 v, extra transistors are provided for over voltage protection.

Figure 2:
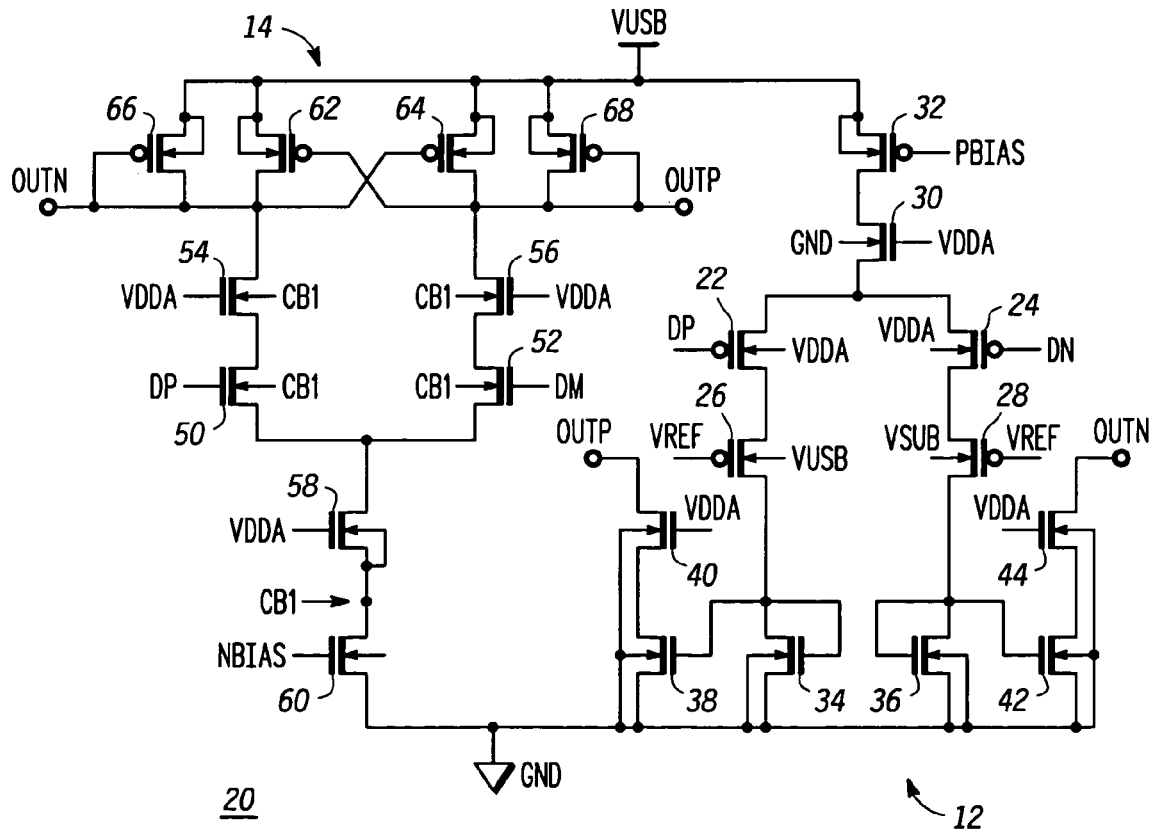
FIG. 2 is a schematic circuit diagram of first and second comparator circuits of the differential receiver circuit of FIG. 1 in accordance with an embodiment of the present invention.

Referring now to FIG. 2, a schematic circuit diagram of a differential comparator 20 including the first and second comparators 12 and 14 is shown. The first and second comparators 12 and 14 allows the receiver circuit 10 to support a large input common mode range (0 to VUSB). The first comparator 12 includes a first PMOS transistor 22 having a gate that receives the first differential input signal (DP), and a second PMOS transistor 24 having a gate that receives the second differential input signal (DN). A third PMOS transistor 26 has a source connected to a drain of the first PMOS transistor 22, and a gate connected to a first internal reference voltage (Vref). The first internal reference voltage (Vref) is about 0.7 v. A fourth PMOS transistor 28 has a source connected to a drain of the third PMOS transistor 26, and a gate connected to the first internal reference voltage (Vref). The first and second PMOS transistors 22 and 24 are the first comparator 12 input transistors and the third and fourth PMOS transistors 26 and 28 are protection transistors for the first comparator 12 input transistors.

The first comparator 12 also includes a first NMOS transistor 30 having a drain connected to a source of the first PMOS transistor 22 and a source of the second PMOS transistor 24, and a gate connected to a second internal reference voltage (VDDA). The second internal reference voltage is about 2.6 v. The first NMOS transistor 30 also protects the first comparator 12 input transistors. A fifth PMOS transistor 32 has a source connected to the external reference voltage (VUSB), a drain connected to a source of the first NMOS transistor 30, and a gate connected to first bias voltage (pbias). The fifth PMOS transistor 32 is a bias transistor of the first comparator 12.

A second NMOS transistor 34 has a drain connected to a drain of the third PMOS transistor 26, a source connected to a ground voltage, and a gate connected to its drain. A third NMOS transistor 36 has a drain connected to a drain of the fourth PMOS transistor 28, a source connected to the ground voltage, and a gate connected to its drain. The second and third NMOS transistors 34 and 36 are load transistors for the first comparator 12. A fourth NMOS transistor 38 has a source connected to the ground voltage, and a gate connected to the gate of the second NMOS transistor 34. A fifth NMOS transistor 40 has a source connected to a drain of the fourth NMOS transistor 38, and a gate connected to the second internal reference voltage (VDDA). A first part (OUTP) of the first differential output signal is generated at a drain of the fifth NMOS transistor 40.

A sixth NMOS transistor 42 has a source connected to the ground voltage, and a gate connected to the gate of the third NMOS transistor 36. A seventh NMOS transistor 44 has a source connected to a drain of the sixth NMOS transistor 42, and a gate connected to the second internal reference voltage (VDDA). A second part (OUTN) of the first differential output signal is generated at a drain of the seventh NMOS transistor 44. The fourth and sixth NMOS transistors 38 and 42 generate the differential output signals of the first comparator 12 and the fifth and seventh NMOS transistors 40 and 44 limit the voltage swing of the drains of the fourth and sixth NMOS transistors 38 and 42.

In one embodiment of the invention, as shown in FIG. 2, a bulk connection of the first PMOS transistor 22 and a bulk of the second PMOS transistor 24 are connected to the second internal reference voltage (VDDA), a bulk connection of the third PMOS transistor 26 and a bulk of the fourth PMOS transistor 28 are connected to the external reference voltage (VUSB), and a bulk connection of the fifth PMOS transistor 32 is connected to the source of the fifth PMOS transistor 32. Bulk connections of the first, second, third, fourth, fifth, sixth and seventh NMOS transistors 30, 34, 36, 38, 40, 42, and 44 are connected to the ground voltage.

Still referring to FIG. 2, the second comparator 14 includes an eighth NMOS transistor 50 having a gate that receives the first differential input signal (DP), and a ninth NMOS transistor 52 having a gate that receives the second differential input signal (DN). A source of the ninth NMOS transistor 52 is connected to a source of the eighth NMOS transistor 50. A tenth NMOS transistor 54 has a source connected to a drain of the eighth NMOS transistor 50, and a gate connected to the second internal reference voltage (VDDA). An eleventh NMOS transistor 56 has a source connected to a drain of the ninth NMOS transistor 52, and a gate connected to the second internal reference voltage (VDDA). The eighth and ninth NMOS transistors 50 and 52 are the second comparator 14 input transistors and the tenth and eleventh NMOS transistors 54 and 56 are protection transistors for the second comparator 14 input transistors.

A twelfth NMOS transistor 58 has a drain connected to the source of the eighth and ninth NMOS transistors 50 and 52, and a gate connected to the second internal reference voltage (VDDA). A thirteenth NMOS transistor 60 has a drain connected to the source of the twelfth NMOS transistor 58 at a node CB1, a source connected to the ground voltage, and a gate connected to a second bias voltage (nbias). The thirteenth NMOS transistor 60 is a bias transistor of the second comparator 14 and the twelfth NMOS transistor 58 protects the thirteenth NMOS transistor 60.

A sixth PMOS transistor 62 has a source connected to the external reference voltage level (VUSB), a drain connected to a drain of the tenth NMOS transistor 54, and a gate connected to a drain of the eleventh NMOS transistor 56. A seventh PMOS transistor 64 has a source connected to the external reference voltage level (VUSB), a source connected to the source of the eleventh NMOS transistor 56, and a gate connected to the drain of the tenth NMOS transistor 54. The sixth and seventh PMOS transistors 62 and 64 are for introducing hysterisis.

An eighth PMOS transistor 66 has a source connected to the external reference voltage level (VUSB), a drain connected to the drain of the sixth PMOS transistor 62, and a gate connected to the drain of the sixth PMOS transistor 62. A first part (OUTN) of the second differential output signal is generated at the drain and gate connection of the eighth PMOS transistor 66. A ninth PMOS transistor 68 has a source connected to the first reference voltage level (VUSB), a drain connected to the drain of the seventh PMOS transistor 64, and a gate connected to its drain. A second part (OUTP) of the second differential output signal is generated at the drain and gate connection of the ninth PMOS transistor 68. The eighth and ninth PMOS transistors 66 and 68 are load transistors for the second comparator 14.

In one embodiment of the invention, as shown in FIG. 2, bulk connections of the eighth, ninth, tenth, eleventh, and twelfth NMOS transistors 50, 52, 54, 56, and 58 are connected to the node CB1, and the bulks of the sixth, seventh, eighth and ninth PMOS transistors 62, 64, 66 and 68 are connected to their respective sources.

In one embodiment of the invention, the current summer 16 is formed by the respective connections of the drain of the fifth NMOS transistor 40 with the ninth PMOS transistor 68, and the drain of the seventh NMOS transistor 44 with the gate of the eighth PMOS transistor 66. The third differential output signal output by the current summer 16 is formed at these aforementioned connections. The differential to single-ended converter 18 can be implemented in various ways, as is known by those of skill in the art.

In one embodiment of the invention, the first internal reference voltage is about 0.7 v, the second internal reference voltage is about 2.6 v, and the external reference voltage level is about 3.3 v. If the input common mode voltage approaches zero, the tenth and eleventh NMOS transistors 54 and 56 will limit the gate to drain and drain to source voltage of the second comparator 14 input pair transistors 50 and 52. Similarly, the third and fourth PMOS transistors 26 and 28 protect the first comparator 12 input transistors 22 and 24.

If both DP and DN are zero and VUSB is 3.6 v, without the tenth and eleventh NMOS transistors 54 and 56, the gate to drain voltage of the eighth and ninth NMOS transistors 50 and 52 would exceed 3 v, which could cause circuit reliability problems. If both DP and DN are 3.6 v, without the third and fourth PMOS transistors 26 and 28, the gate to drain voltage of the first and second PMOS transistors 22 and 24 will exceed 3 v. It should be noted that the twelfth NMOS transistor 58 prevents the drain to source voltage of the thirteenth NMOS transistor 60 from exceeding 3 v.

While various embodiments of the invention have been illustrated and described, it will be clear that the invention is not limited to these embodiments only. Numerous modifications, changes, variations, substitutions, and equivalents will be apparent to those skilled in the art, without departing from the spirit and scope of the invention, as described in the claims.

The invention claimed is:

1. A differential receiver circuit that receives a differential input signal including a first input signal (DP) and a second input signal (DN), and generates a single-ended output signal, the receiver circuit comprising:
   a first comparator that receives the differential input signal and generates a first differential output signal, wherein the first comparator comprises a first plurality of transistors;
   a second comparator that receives the differential input signal and generates a second differential output signal, wherein the second comparator comprises a second plurality of transistors;
   a current summer connected to the first and second comparators that receives the first and second differential output signals and generates a third differential output signal; and
   a differential to single-ended converter connected to the current summer that receives the third differential output signal and generates the single-ended output signal, wherein the differential input signal varies from a ground voltage level to an external reference voltage level (VUSB), and the first and second pluralities of transistors comprise devices that operate at an internal reference voltage level that is lower than the external reference voltage level, and
   wherein the first comparator comprises:
      a first PMOS transistor having a gate that receives the first differential input signal (DP);
      a second PMOS transistor having a gate that receives the second differential input signal (DN);
      a third PMOS transistor having a source connected to a drain of the first PMOS transistor, and a gate connected to a first internal reference voltage (Vref);
      a fourth PMOS transistor having a source connected to a drain of the third PMOS transistor, and a gate connected to the first internal reference voltage (Vref);
      a first NMOS transistor having a drain connected to a source of the first PMOS transistor and a source of the second PMOS transistor, and a gate connected to a second internal reference voltage (VDDA);
      a fifth PMOS transistor having a source connected to the external reference voltage (VUSB), a drain connected, to a drain-of the first PMOS transistor, and a gate connected to a first bias voltage (pbias);
      a second NMOS transistor having a drain connected to a drain of the third PMOS transistor, a source connected to a ground voltage, and a gate connected to its drain;
      a third NMOS transistor having a drain connected to a drain of the fourth PMOS transistor, a source connected to the ground voltage, and a gate connected to its drain;
      a fourth NMOS transistor having a source connected to the ground voltage, and a gate connected to the gate of the second NMOS transistor;
      a fifth NMOS transistor having a source connected to a drain of the fourth NMOS transistor, a gate connected to the second internal reference voltage (VDDA), and wherein a first part (OUTP) of the first differential output signal is generated at a drain of the fifth NMOS transistor;
      a sixth NMOS transistor having a source connected to the ground voltage, and a gate connected to the gate of the third NMOS transistor; and
      a seventh NMOS transistor having a source connected to a drain of the sixth NMOS transistor, a gate connected to the second internal reference voltage (VDDA), and wherein a second part (OUTN) of the first differential output signal is generated at a drain of the seventh NMOS transistor.

2. The differential receiver circuit of claim 1, wherein:
   a bulk connection of the first PMOS transistor and a bulk of the second PMOS transistor are connected to the second internal reference voltage (VDDA);
   a bulk connection of the third PMOS transistor and a bulk of the fourth PMOS transistor are connected to the external reference voltage (VUSB);
   a bulk connection of the fifth PMOS transistor is connected to the source of the fifth PMOS transistor;
   the bulk connections of the first, second, third, fourth, fifth, sixth and seventh NMOS transistors are connected to the ground voltage.

3. The differential receiver circuit of claim 1, wherein the second comparator comprises:
   an eighth NMOS transistor having a gate that receives the first differential input signal (DP);
   a ninth NMOS transistor having a gate that receives the second differential input signal (DN) and a source connected to a source of the eighth NMOS transistor;
   a tenth NMOS transistor having a source connected to a drain of the eighth NMOS transistor, and a gate connected to the second internal reference voltage (VDDA);
   an eleventh NMOS transistor having a source connected to a drain of the ninth NMOS transistor, and a gate connected to the second internal reference voltage (VDDA);
   a twelfth NMOS transistor having a drain connected to the source of the eighth and ninth NMOS transistors, and a gate connected to the second internal reference voltage (VDDA);
   a thirteenth NMOS transistor having a drain connected to the source of the twelfth NMOS transistor at a node CB1, a source connected to the ground voltage, and a gate connected to a second bias voltage (nbias);
   a sixth PMOS transistor having a source connected to the external reference voltage level (VUSB), a drain connected to a drain of the tenth NMOS transistor, and a gate connected to a drain of the eleventh NMOS transistor;
   a seventh PMOS transistor having a source connected to the external reference voltage level (VUSB), a drain connected to the drain of the eleventh NMOS transistor, and a gate connected to the drain of the tenth NMOS transistor;
   an eighth PMOS transistor having a source connected to the external reference voltage level (VUSB), a drain connected to the drain of the sixth PMOS transistor, and a gate connected to the drain of the sixth PMOS transistor, wherein a first part (OUTN) of the second differential output signal is generated at the drain and gate connection of the eighth PMOS transistor; and
   a ninth PMOS transistor having a source connected to the first reference voltage level (VUSB), a drain connected to the drain of the seventh PMOS transistor, and a gate connected to its drain, wherein a second part (OUTP) of the second differential output signal is generated at the drain and gate connection of the ninth PMOS transistor.

4. The differential receiver circuit of claim 3, wherein the bulks of the eighth, ninth, tenth, eleventh, and twelfth transistors are connected to the node CB1, and the bulks of the sixth, seventh, eighth and ninth PMOS transistors are connected to their respective sources.

5. The differential receiver circuit of claim 3, wherein the current summer is formed by the connection of the drain of the fifth NMOS transistor and the ninth PMOS transistor, and the connection of drain of the seventh NMOS transistor and the gate of the eighth PMOS transistor, and wherein the third differential output signal is formed at said connections.

6. The differential receiver circuit of claim 5, wherein the first internal reference voltage is about 0.7v, the second internal reference voltage is about 2.6v, and the external reference voltage level is about 3.3v.

7. A differential receiver circuit that receives a differential input signal including a first input signal (DP) and a second input signal (DN), and generates a single-ended output signal, the receiver circuit comprising:
- a first comparator that receives the differential input signal and generates a first differential output signal, wherein the first comparator comprises a first plurality of transistors;
- a second comparator that receives the differential input signal and generates a second differential output signal, wherein the second comparator comprises a second plurality of transistors;
- a current summer that receives the first and second differential output signals and generates a third differential output signal; and
- a differential to single-ended converter that receives the third differential output signal and generates the single-ended output signal, and wherein the differential input signal varies from a ground voltage level to an external reference voltage level (VUSB), and the first and second pluralities of transistors comprise devices that operate at an internal reference voltage level that is lower than the external reference voltage level; and wherein the first comparator comprises:
- a first PMOS transistor having a gate that receives the first differential input signal (DP);
- a second PMOS transistor having a gate that receives the second differential input signal (DN);
- a third PMOS transistor having a source connected to a drain of the first PMOS transistor, and a gate connected to a first internal reference voltage (Vref);
- a fourth PMOS transistor having a source connected to a drain of the third PMOS transistor, and a gate connected to the first internal reference voltage (Vref);
- a first NMOS transistor having a source connected to a source of the first PMOS transistor and a source of the second PMOS transistor, and a gate connected to a second internal reference voltage (VDDA);
- a fifth PMOS transistor having a source connected to the external reference voltage (VUSB), a drain connected to a drain of the first NMOS transistor, and a gate connected to a first bias voltage (pbias);
- a second NMOS transistor having a drain connected to a drain of the third PMOS transistor, a source connected to a ground voltage, and a gate connected to its drain;
- a third NMOS transistor having a source connected to a drain of the fourth PMOS transistor, a source connected to the ground voltage, and a gate connected to its drain;
- a fourth NMOS transistor having a source connected to the ground voltage, and a gate connected to the gate of the second NMOS transistor;
- a fifth NMOS transistor having a source connected to a drain of the fourth NMOS transistor, a gate connected to the second internal reference voltage (VDDA), and wherein a first part (OUTP) of the first differential output signal is generated at a drain of the fifth NMOS transistor;
- a sixth NMOS transistor having a source connected to the ground voltage, and a gate connected to the gate of the third NMOS transistor; and
- a seventh NMOS transistor having a source connected to a drain of the sixth NMOS transistor, a gate connected to the second internal reference voltage (VDDA), and wherein a second part (OUTN) of the first differential output signal is generated at a drain of the seventh NMOS transistor; and wherein the second comparator comprises:
- an eighth NMOS transistor having a gate that receives the first differential input signal (DP);
- a ninth NMOS transistor having a gate that receives the second differential input signal (DN) and a source connected to a source of the eighth NMOS transistor;
- a tenth NMOS transistor having a source connected to a drain of the eighth NMOS transistor, and a gate connected to the second internal reference voltage (VDDA);
- an eleventh NMOS transistor having a source connected to a drain of the ninth NMOS transistor, and a gate connected to the second internal reference voltage (VDDA);
- a twelfth NMOS transistor having a drain connected to the sources of the eighth and ninth NMOS transistors, and a gate connected to the second internal reference voltage (VDDA);
- a thirteenth NMOS transistor having a drain connected to the source of the twelfth NMOS transistor at a node CB1, a source connected to the ground voltage, and a gate connected to a second bias voltage (nbias);
- a sixth PMOS transistor having a source connected to the external reference voltage level (VUSB), a drain connected to a drain of the tenth NMOS transistor, and a gate connected to a drain of the eleventh NMOS transistor;
- a seventh PMOS transistor having a source connected to the external reference voltage level (VUSB), a drain connected to the drain of the eleventh NMOS transistor, and a gate connected to the drain of the tenth NMOS transistor;
- an eighth PMOS transistor having a source connected to the external reference voltage level (VUSB), a drain connected to the drain of the sixth PMOS transistor, and a gate connected to the drain of the sixth PMOS transistor, wherein a first part (OUTN) of the second differential output signal is generated at the drain and gate connection of the eighth PMOS transistor; and
- a ninth PMOS transistor having a source connected to the first reference voltage level (VUSB), a drain connected to the drain of the seventh PMOS transistor, and a gate connected to its drain, wherein a second part (OUTP) of the second differential output signal is generated at the drain and gate connection of the ninth PMOS transistor.

* * * * *